US009715260B2

(12) United States Patent
Eriksen

(10) Patent No.: US 9,715,260 B2
(45) Date of Patent: *Jul. 25, 2017

(54) COOLING SYSTEM FOR A COMPUTER SYSTEM

(71) Applicant: Asetek Danmark A/S, Aalborg East (DK)

(72) Inventor: André Sloth Eriksen, Morgan Hill, CA (US)

(73) Assignee: ASETEK DANMARK A/S, Aalborg East (DK)

( * ) Notice: Subject to any disclaimer, the term of this patent is extended or adjusted under 35 U.S.C. 154(b) by 0 days.

This patent is subject to a terminal disclaimer.

(21) Appl. No.: 15/347,938

(22) Filed: Nov. 10, 2016

(65) Prior Publication Data

US 2017/0075398 A1 Mar. 16, 2017

Related U.S. Application Data

(60) Continuation of application No. 13/942,922, filed on Jul. 16, 2013, now abandoned, which is a
(Continued)

(51) Int. Cl.
  *G06F 1/20* (2006.01)
  *H05K 7/20* (2006.01)
  *F28D 15/00* (2006.01)

(52) U.S. Cl.
  CPC .............. *G06F 1/206* (2013.01); *G06F 1/20* (2013.01); *H05K 7/20154* (2013.01);
(Continued)

(58) Field of Classification Search
  CPC ...... G06F 1/20; G06F 1/206; G06F 2200/201; F28D 15/00; F28F 2250/08; H05K 7/20154; H05K 7/20263; H05K 7/20272
(Continued)

(56) References Cited

U.S. PATENT DOCUMENTS

| 3,810,509 A | 5/1974 | Kun |
| 4,109,707 A | 8/1978 | Wilson et al. |

(Continued)

FOREIGN PATENT DOCUMENTS

| CN | M24451 | 9/2004 |
| DE | 195 34 423 A1 | 3/1997 |

(Continued)

OTHER PUBLICATIONS

Notice of Allowability with Examiner's Reason for Allowance mailed on May 17, 2012 in U.S. Appl. No. 12/826,768 (4 pages).
(Continued)

*Primary Examiner* — Tho V Duong

(74) *Attorney, Agent, or Firm* — Finnegan, Henderson, Farabow, Garrett & Dunner LLP

(57) ABSTRACT

A cooling system for a computer system comprises at least one unit such as a central processing unit (CPU) generating thermal energy and a reservoir having an amount of cooling liquid, said cooling liquid intended for accumulating and transferring of thermal energy dissipated from the processing unit to the cooling liquid. The cooling system has a heat exchanging interface for providing thermal contact between the processing unit and the cooling liquid for dissipating heat from the processing unit to the cooling liquid. Different embodiments of the heat exchanging system as well as means for establishing and controlling a flow of cooling liquid and a cooling strategy constitutes the invention of the cooling system.

19 Claims, 9 Drawing Sheets

Related U.S. Application Data continuation of application No. 13/547,240, filed on Jul. 12, 2012, now abandoned, which is a continuation of application No. 12/826,768, filed on Jun. 30, 2010, now Pat. No. 8,240,362, which is a division of application No. 10/578,578, filed as application No. PCT/DK2004/000775 on Nov. 8, 2004, now Pat. No. 7,971,632.

(52) U.S. Cl.
CPC ..... *H05K 7/20263* (2013.01); *H05K 7/20272* (2013.01); *F28D 15/00* (2013.01); *F28F 2250/08* (2013.01); *G06F 2200/201* (2013.01)

(58) Field of Classification Search
USPC .......................................... 165/80.4; 361/699
See application file for complete search history.

(56) References Cited

U.S. PATENT DOCUMENTS

| | | | |
|---|---|---|---|
| 4,520,298 A | 5/1985 | Abbondanti | |
| 4,563,620 A | 1/1986 | Komatsu | |
| 4,777,578 A | 10/1988 | Jahns | |
| 4,898,579 A | 2/1990 | Groshong et al. | |
| 5,001,548 A | 3/1991 | Iversen | |
| 5,006,924 A | 4/1991 | Frankeny et al. | |
| 5,070,936 A | 12/1991 | Carroll et al. | |
| 5,142,214 A | 8/1992 | Purson et al. | |
| 5,316,077 A | 5/1994 | Reichard | |
| 5,441,102 A | 8/1995 | Burward-Hoy | |
| 5,566,745 A | 10/1996 | Hill et al. | |
| 5,708,564 A | 1/1998 | Lin | |
| 5,731,954 A | 3/1998 | Cheon | |
| 5,763,951 A | 6/1998 | Hamilton et al. | |
| 5,784,257 A | 7/1998 | Tata | |
| 5,825,622 A | 10/1998 | Rife et al. | |
| 5,890,880 A | 4/1999 | Lustwerk | |
| 5,901,037 A | 5/1999 | Hamilton et al. | |
| 6,019,165 A | 2/2000 | Batchelder | |
| 6,021,844 A | 2/2000 | Batchelder | |
| 6,114,827 A | 9/2000 | Alvaro | |
| 6,141,217 A | 10/2000 | Nakahama et al. | |
| 6,166,907 A | 12/2000 | Chien | |
| 6,170,563 B1 | 1/2001 | Hsieh | |
| 6,263,957 B1 | 7/2001 | Chen et al. | |
| 6,305,463 B1 | 10/2001 | Salmonson | |
| 6,343,478 B1 | 2/2002 | Chang | |
| 6,408,937 B1 | 6/2002 | Roy | |
| 6,415,860 B1 | 7/2002 | Kelly et al. | |
| 6,447,270 B1 | 9/2002 | Schmidt et al. | |
| 6,470,289 B1 | 10/2002 | Peters | |
| 6,529,376 B2 | 3/2003 | Hamman | |
| 6,551,734 B1 | 4/2003 | Simpkins et al. | |
| 6,580,610 B2 | 6/2003 | Morris et al. | |
| 6,668,911 B2 | 12/2003 | Bingler | |
| 6,702,002 B2 | 3/2004 | Wang | |
| 6,725,682 B2 | 4/2004 | Scott | |
| 6,728,107 B2 | 4/2004 | Tseng et al. | |
| 6,749,012 B2 | 6/2004 | Gwin et al. | |
| 6,796,370 B1 | 9/2004 | Doll | |
| 6,892,802 B2 | 5/2005 | Kelly et al. | |
| 6,894,899 B2 | 5/2005 | Wu et al. | |
| 6,915,653 B2 * | 7/2005 | Nakano | 62/259.2 |
| 6,945,315 B1 | 9/2005 | Gektin et al. | |
| 6,952,345 B2 | 10/2005 | Weber et al. | |
| 6,967,841 B1 | 11/2005 | Chu et al. | |
| 6,972,954 B2 | 12/2005 | Minamitani et al. | |
| 6,992,887 B2 | 1/2006 | Jairazbhoy et al. | |
| 7,055,581 B1 | 6/2006 | Roy | |
| 7,100,389 B1 | 9/2006 | Wayburn | |
| 7,215,546 B2 | 5/2007 | Hata et al. | |
| 7,298,617 B2 | 11/2007 | Campbell et al. | |
| 7,325,588 B2 | 2/2008 | Malone et al. | |
| 7,325,591 B2 | 2/2008 | Duan et al. | |
| 7,359,197 B2 | 4/2008 | Stefanoski et al. | |
| 7,455,103 B2 | 11/2008 | Sato et al. | |
| 7,544,049 B2 | 6/2009 | Koga | |
| 7,591,302 B1 | 9/2009 | Lenehan et al. | |
| 7,971,632 B2 | 7/2011 | Eriksen | |
| 8,240,362 B2 | 8/2012 | Eriksen | |
| 2002/0117291 A1 | 8/2002 | Cheon | |
| 2003/0010050 A1 | 1/2003 | Scott | |
| 2003/0039097 A1 | 2/2003 | Igarashi | |
| 2003/0056939 A1 | 3/2003 | Chu et al. | |
| 2003/0151895 A1 | 8/2003 | Zuo | |
| 2004/0042176 A1 | 3/2004 | Niwatsukino et al. | |
| 2004/0052048 A1 | 3/2004 | Wu et al. | |
| 2004/0052049 A1 | 3/2004 | Wu et al. | |
| 2004/0052663 A1 | 3/2004 | Laing et al. | |
| 2004/0105232 A1 | 6/2004 | Ito et al. | |
| 2004/0141275 A1 | 7/2004 | Athari | |
| 2004/0190254 A1 | 9/2004 | Hu et al. | |
| 2005/0052847 A1 | 3/2005 | Hamman | |
| 2005/0061482 A1 | 3/2005 | Lee et al. | |
| 2005/0069432 A1 | 3/2005 | Tomioka | |
| 2005/0083656 A1 | 4/2005 | Hamman | |
| 2005/0126750 A1 | 6/2005 | Yokozawa et al. | |
| 2005/0128705 A1 | 6/2005 | Chu et al. | |
| 2005/0183848 A1 | 8/2005 | Cheng et al. | |
| 2005/0243518 A1 | 11/2005 | Hata et al. | |
| 2006/0113066 A1 | 6/2006 | Mongia et al. | |
| 2006/0157230 A1 | 7/2006 | Kawahara et al. | |
| 2006/0161311 A1 | 7/2006 | Vinson et al. | |
| 2006/0169440 A1 | 8/2006 | Chou et al. | |
| 2007/0000268 A1 | 1/2007 | Crocker et al. | |

FOREIGN PATENT DOCUMENTS

| | | |
|---|---|---|
| DK | PCT/DK2005/000310 | 11/2006 |
| EP | 0105687 A1 | 4/1984 |
| EP | 0400455 A1 | 5/1990 |
| EP | 0574823 A2 | 12/1993 |
| EP | 0610826 A2 | 8/1994 |
| JP | 2002-151638 A | 5/2002 |
| JP | 3452059 | 9/2003 |
| TW | M256682 U | 2/2005 |
| WO | WO 01/25881 A | 4/2001 |
| WO | WO 2005/017468 A2 | 2/2005 |
| WO | WO 2005/045654 A2 | 5/2005 |
| WO | WO 2006/119761 | 11/2006 |

OTHER PUBLICATIONS

Notice of Allowability with Examiner's Reason for Allowance mailed on May 23, 2012 in U.S. Appl. No. 13/269,234 (4 pages).
Notice of Allowability with Reason for Allowance mailed on Apr. 8, 2011 in U.S. Appl. No. 10/578,578 (9 pages).
Order re: Claim Construction for U.S. Pat. Nos. 8,240,362 and 8,245,764 in U.S. District Court, Northern District of California, Case Nos. C-12-4498 EMC and C-13-0457 JST, filed Dec. 3, 2013 (18 pages).
Third Party Observation for European Application No. EP20080100686 submitted on Aug. 15, 2014 (8 pages).
Third Party Observation for European Application No. EP20080100686 submitted on Aug. 18, 2014 (7 pages).
Office Action mailed on Aug. 22, 2007 in U.S. Appl. No. 10/578,578 (7 pages).
Office Action mailed on Apr. 25, 2008 in U.S. Appl. No. 10/578,578 (10 pages).
Office Action mailed on Aug. 18, 2008 in U.S. Appl. No. 10/578,578 (9 pages).
Office Action mailed on Mar. 20, 2009 in U.S. Appl. No. 10/578,578 (12 pages).
Office Action mailed on Jul. 15, 2009 in U.S. Appl. No. 10/578,578 (13 pages).
Office Action mailed on Apr. 13, 2010 in U.S. Appl. No. 10/578,578 (14 pages).
Office Action mailed on Nov. 24, 2010 in U.S. Appl. No. 10/578,578 (10 pages).

(56) References Cited

OTHER PUBLICATIONS

Office Action mailed on Nov. 23, 2011 in U.S. Appl. No. 12/826,802 (11 pages).
Office Action mailed on Dec. 5, 2011 in U.S. Appl. No. 12/826,768 (14 pages).
Office Action mailed on Dec. 20, 2011 in U.S. Appl. No. 13/269,234 (13 pages).
Office Action mailed on Mar. 13, 2012 in U.S. Appl. No. 13/269,234 (12 pages).
Office Action mailed on Mar. 27, 2012 in U.S. Appl. No. 11/919,974 (21 pages).
Office Action mailed on Sep. 12, 2012 in U.S. Appl. No. 13/547,240 (11 pages).
Office Action mailed on Jan. 16, 2013 in U.S. Appl. No. 13/547,240 (9 pages).

* cited by examiner

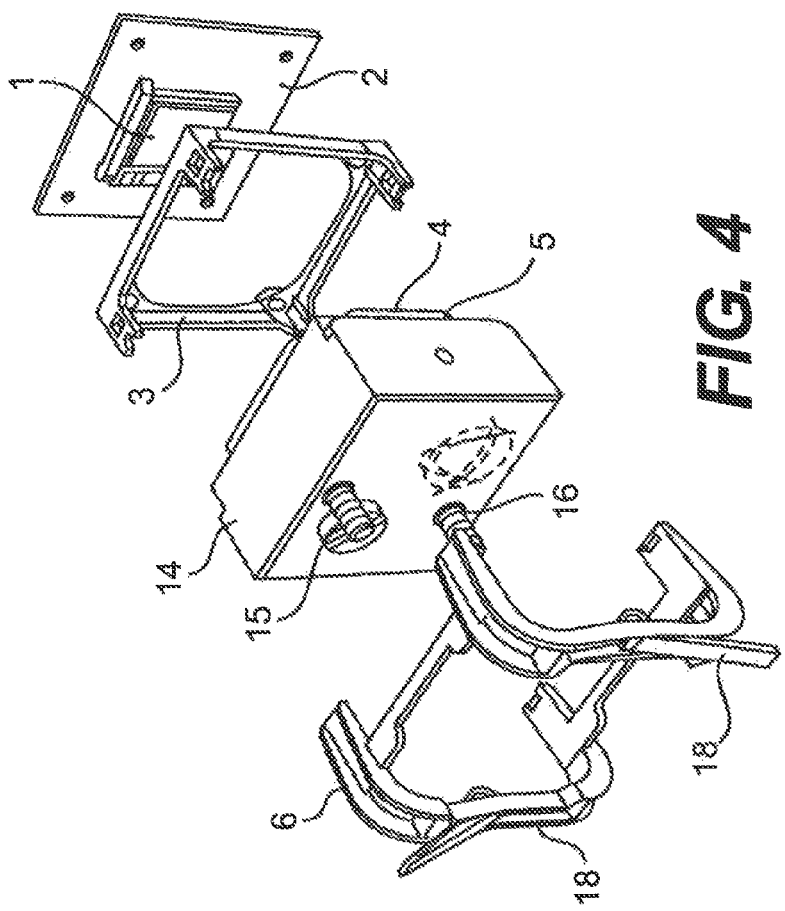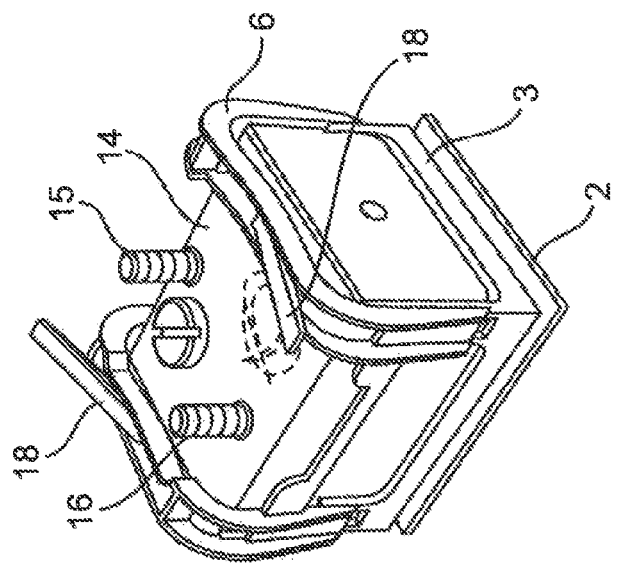

COOLING SYSTEM FOR A COMPUTER SYSTEM

This is a continuation application of application Ser. No. 13/942,922 filed Jul. 16, 2013, which is a continuation application of application Ser. No. 13/547,240 filed Jul. 12, 2012, which is a continuation application of application Ser. No. 12/826,768 filed Jun. 30, 2010 (issued on Aug. 14, 2012 as U.S. Pat. No. 8,240,362), which is a divisional of application Ser. No. 10/578,578, filed May 5, 2006 (issued on Jul. 5, 2011 as U.S. Pat. No. 7,971,632 B2), which is a U.S. national phase application of PCT/DK2004/000775 filed on Nov. 8, 2004. These applications are incorporated by their entirety herein by reference.

BACKGROUND OF THE INVENTION

The present invention relates to a cooling system for a central processing unit (CPU) or other processing unit of a computer system. More specifically, the invention relates to a liquid-cooling system for a mainstream computer system such as a PC.

During operation of a computer, the heat created inside the CPU or other processing unit must be carried away fast and efficiently, keeping the temperature within the design range specified by the manufacturer. As an example of cooling systems, various CPU cooling methods exist and the most used CPU cooling method to date has been an air-cooling arrangement, wherein a heat sink in thermal contact with the CPU transports the heat away from the CPU and as an option a fan mounted on top of the heat sink functions as an air fan for removing the heat from the heat sink by blowing air through segments of the heat sink. This air-cooling arrangement is sufficient as long as the heat produced by the CPU is kept at today's level, however it becomes less useful in future cooling arrangements when considering the development of CPUs since the speed of a CPU is said to double perhaps every 18 months, thus increasing the heat production accordingly.

Another design used today is a CPU cooling arrangement where cooling liquid is used to cool the CPU by circulating a cooling liquid inside a closed system by means of a pumping unit, and where the closed system also comprises a heat exchanger past which the cooling liquid is circulated.

A liquid-cooling arrangement is more efficient than an air-cooling arrangement and tends to lower the noise level of the cooling arrangement in general. However, the liquid-cooling design consists of many components, which increases the total installation time, thus making it less desirable as a mainstream solution. With a trend of producing smaller and more compact PCs for the end-users, the greater amount of components in a typical liquid-cooling arrangement is also undesirable. Furthermore, the many components having to be coupled together incurs a risk of leakage of cooling liquid from the system.

SUMMARY OF INVENTION

It may be one object of the invention to provide a small and compact liquid-cooling solution, which is more efficient than existing air-cooling arrangements and which can be produced at a low cost enabling high production volumes. It may be another object to create a liquid-cooling arrangement, which is easy-to-use and implement, and which requires a low level of maintenance or no maintenance at all. It may be still another object of the present invention to create a liquid-cooling arrangement, which can be used with existing CPU types, and which can be used in existing computer systems.

This object may be obtained by a cooling system for a computer system, said computer system comprising: at least one unit such as a central processing unit (CPU) generating thermal energy and said cooling system intended for cooling the at least one processing unit, a reservoir having an amount of cooling liquid, said cooling liquid intended for accumulating and transferring of thermal energy dissipated from the processing unit to the cooling liquid, a heat exchanging interface for providing thermal contact between the processing unit and the cooling liquid for dissipating heat from the processing unit to the cooling liquid, a pump being provided as part of an integrate element, said integrate element comprising the heat exchanging interface, the reservoir and the pump, said pump intended for pumping the cooling liquid into the reservoir, through the reservoir and from the reservoir to a heat radiating means,—said heat radiating means intended for radiating thermal energy from the cooling liquid, dissipated to the cooling liquid, to surroundings of the heat radiating means.

By providing an integrate element, it is possible to limit the number of separate elements of the system. However, there is actually no need for limiting the number of elements, because often there is enough space within a cabinet of a computer system to encompass the different individual elements of the cooling system. Thus, it is surprisingly that, at all, any attempt is conducted of integrating some of the elements.

In preferred embodiments according to this aspect of the invention, the pump is placed inside the reservoir with at least an inlet or an outlet leading to the liquid in the reservoir. In an alternative embodiment the pump is placed outside the reservoir in the immediate vicinity of the reservoir and wherein at least an inlet or an outlet is leading directly to the liquid in the reservoir. By placing the pump inside the reservoir or in the immediate vicinity outside the reservoir, the integrity of the combined reservoir, heat exchanger and pump is obtained, so that the element is easy to employ in new and existing computer systems, especially mainstream computer systems.

The object may also be obtained by a cooling system for a computer system, said computer system comprising: at least one unit such as a central processing unit (CPU) generating thermal energy and said cooling system intended for cooling the at least one processing unit, a reservoir having an amount of cooling liquid, said cooling liquid intended for accumulating and transferring of thermal energy dissipated from the processing unit to the cooling liquid, a heat exchanging interface for providing thermal contact between the processing unit and the cooling liquid for dissipating heat from the processing unit to the cooling liquid, a pump intended for pumping the cooling liquid into the reservoir, through the reservoir and from the reservoir to a heat radiating means, said cooling system being intended for thermal contact with the processing unit by means of existing fastening means associated with the processing unit, and said heat radiating means intended for radiating from the cooling liquid thermal energy, dissipated to the cooling liquid, to surroundings of the heat radiating means.

The use of existing fastening means has the advantage that fitting of the cooling system is fast and easy. However, once again there is no problem for the person skilled in the art to adopt specially adapted mounting means for any element of the cooling system, because there are numerous possibilities in existing cabinets of computer systems for mounting any kind of any number of elements, also elements of a cooling system.

In preferred embodiments according to this aspect of the invention, the existing fastening means are means intended for attaching a heat sink to the processing unit, or the existing fastening means are means intended for attaching a cooling fan to the processing unit, or the existing fastening means are means intended for attaching a heat sink together with a cooling fan to the processing unit. Existing fastening means of the kind mentioned is commonly used for air cooling of CPUs of computer systems, however, air cooling arrangements being much less complex than liquid cooling systems. Nevertheless, it has ingeniously been possible to develop a complex and effective liquid cooling system capable of utilising such existing fastening means for simple and less effective air cooling arrangements.

According to an aspect of the invention, the pump is selected from the following types: Bellows pump, centrifugal pump, diaphragm pump, drum pump, flexible liner pump, flexible impeller pump, gear pump, peristaltic tubing pump, piston pump, processing cavity pump, pressure washer pump, rotary lobe pump, rotary vane pump and electro-kinetic pump. By adopting one or more of the solution of the present invention, a wide variety of pumps may be used without departing from the scope of the invention.

According to another aspect of the invention, driving means for driving the pump is selected among the following driving means: electrically operated rotary motor, piezo-electrically operated motor, permanent magnet operated motor, fluid-operated motor, capacitor-operated motor. As is the case when selecting the pump to pump the liquid, by adopting one or more of the solution of the present invention, a wide variety of pumps may be used without departing from the scope of the invention.

The object may also be obtained by a cooling system for a computer system, said computer system comprising: at least one unit such as a central processing unit (CPU) generating thermal energy and said cooling system intended for cooling the at least one processing unit, a reservoir having an amount of cooling liquid, said cooling liquid intended for accumulating and transferring of thermal energy dissipated from the processing unit to the cooling liquid, a heat exchanging interface for providing thermal contact between the processing unit and the cooling liquid for dissipating heat from the processing unit to the cooling liquid, a pump intended for pumping the cooling liquid into the reservoir, through the reservoir and from the reservoir to a heat radiating means, and said cooling system further comprising a pump wherein the pump is driven by an AC electrical motor by a DC electrical power supply of the computer system, where at least part of the electrical power from said power supply is intended for being converted to AC being supplied to the electrical motor.

It may be advantageous to use an AC motor, such as a 12V AC motor, for driving the pump in order to obtain a stabile unit perhaps having to operate 24 hours a day, 365 days a year. However, the person skilled in the art will find it unnecessary to adopt as example a 12V motor because high voltage such as 220V or 110V is readily accessible as this is the electrical voltage used to power the voltage supply of the computer system itself. Although choosing to use a 12V motor for the pump, it has never been and will never be the choice of the person skilled in the art to use an AC motor. The voltage supplied by the voltage supply of the computer system itself is DC, thus this will be the type of voltage chosen by the skilled person. In preferred embodiments according to any aspect of the invention, an electrical motor is intended both for driving the pump for pumping the liquid and for driving the a fan for establishing a flow of air in the vicinity of the reservoir, or an electrical motor is intended both for driving the pump for pumping the liquid and for driving the a fan for establishing a flow of air in the vicinity of the heat radiating means, or an electrical motor is intended both for driving the pump for pumping the liquid, and for driving the a fan for establishing a flow of air in the vicinity of the reservoir, and for driving the a fan for establishing a flow of air in the vicinity of the heat radiating means.

By utilising a single electrical motor for driving more than one element of the cooling system according to any of the aspects of the invention, the lesser complexity and the reliability of the cooling system will be further enhanced.

The heat exchanging interface may be an element being separate from the reservoir, and where the heat exchanging interface is secured to the reservoir in a manner so that the heat exchanging interface constitutes part of the reservoir when being secured to the reservoir. Alternatively, the heat exchanging interface constitutes an integrate surface of the reservoir, and where the heat exchanging surface extends along an area of the surface of the reservoir, said area of surface being intended for facing the processing unit and said area of surface being intended for the close thermal contact with the processing unit. Even alternatively, the heat exchanging interface is constitutes by a free surface of the processing unit, and where the free surface is capable of establishing heat dissipation between the processing unit and the cooling liquid through an aperture provided in the reservoir, and where the aperture extends along an area of the surface of the reservoir, said surface being intended for facing the processing unit.

The object may also be obtained by a cooling system for a computer system, said computer system comprising: at least one unit such as a central processing unit (CPU) generating thermal energy and said cooling system intended for cooling the at least one processing unit comprising, a reservoir having an amount of cooling liquid, said cooling liquid intended for accumulating and transferring of thermal energy dissipated from the processing unit to the cooling liquid, a heat exchanging interface for providing thermal contact between the processing unit and the cooling liquid for dissipating heat from the processing unit to the cooling liquid, a pumping means being intended for pumping the cooling liquid into the reservoir, through the reservoir and from the reservoir to a heat radiating means, said heat radiating means intended for radiating thermal energy from the cooling liquid, dissipated to the cooling liquid, to surroundings of the heat radiating means, said heat exchanging interface constituting a heat exchanging surface being manufactured from a material suitable for heat conducting, and with a first side of the heat exchanging surface facing the central processing unit being substantially plane and with a second side of the heat exchanging surface facing the cooling liquid being substantially plane and said reservoir being manufactured from plastic, and channels or segments being provided in the reservoir for establishing a certain flow-path for the cooling liquid through the reservoir.

Providing a plane heat exchanging surface, both the first, inner side and on the second, outer side, results in the costs for manufacturing the heat exchanging surface is reduced to an absolute minimum. However, a plane first, inner surface may also result in the cooling liquid passing the heat exchanging surface too fast. This may be remedied by providing grooves along the inner surface, thereby providing a flow path in the heat exchanging surface. This however results in the costs for manufacturing the heat exchanging surface increasing. The solution to this problem according to the invention has been dealt with by providing channels or segments in the reservoir housing in stead. The reservoir housing may be manufactured by injection moulding or by casting, depending on the material which the reservoir housing is made from. Proving channels or segments during moulding or casting of the reservoir housing is much more cost-effective than milling grooves along the inner surface of the heat exchanging surface.

The object may also be obtained by a cooling system for a computer system, said computer system comprising: at least one unit such as a central processing unit (CPU) generating thermal energy and said cooling system intended for cooling the at least one processing unit comprising, at least one liquid reservoir mainly for dissipating or radiating heat, said heat being accumulated and transferred by said cooling liquid, said cooling system being adapted such as to provide transfer of said heat from a heat dissipating surface to a heat radiating surface where said at least one liquid reservoir being provided with one aperture intended for being closed by placing said aperture covering part of, alternatively covering the whole of, the at least one processing unit in such a way that a free surface of the processing unit is in direct heat exchanging contact with an interior of the reservoir, and thus in direct heat exchanging contact with the cooling liquid in the reservoir, through the aperture.

Heat dissipation from the processing unit to the cooling liquid must be very efficient to ensure proper cooling of the processing unit, Especially in the case, where the processing unit is a CPU, the surface for heat dissipation is limited by the surface area of the CPU. This may be remedied by utilising a heat exchanging surface being made of a material having a high thermal conductivity such as copper or aluminium and ensuring a proper thermal bondage between the heat exchanging surface and the CPU.

However, in a possible embodiment according to the features in the above paragraph, the heat dissipation takes place directly between the processing unit and the cooling liquid by providing an aperture in the reservoir housing, said aperture being adapted for taking up a free surface of the processing unit. Thereby, the free surface of the processing unit extends into the reservoir or constitutes a part of the boundaries of the reservoir, and the cooling liquid has direct access to the free surface of the processing unit.

According to one aspect of the invention, a method is envisaged, said method of cooling a computer system comprising at least one unit such as a central processing unit (CPU) generating thermal energy and said method utilising a cooling system for cooling the at least one processing unit and, said cooling system comprising a reservoir, at least one heat exchanging interface, an air blowing fan, a pumping means, said method of cooling comprising the steps of applying one of the following possibilities of how to operate the computer system: establishing, or defining, or selecting an operative status of the computer system, controlling the operation of at least one of the following means of the computer system; the pumping means and the air blowing fan in response to at least one of the following parameters; a surface temperature of the heat generating processing unit, an internal temperature of the heat generating processing unit, or a processing load of the CPU and in accordance with the operative status being established, defined or selected, controlling the operation of the computer system in order to achieve at least one of the following conditions; a certain cooling performance of the cooling system, a certain electrical consumption of the cooling system, a certain noise level of the cooling system.

Applying the above method ensures an operation of the computer system being in accordance with selected properties during the use of the computer system. For some applications, the cooling performance is vital such as may be the case when working with image files or when downloading large files from a network during which the processing units is highly loaded and thus generating much heat. For other applications, the electrical power consumption is more vital such as may be the case when utilising domestic computer systems or in large office building in environments where the electrical grid may be weak such as in third countries. In still other applications, the noise generated by the cooling system is to be reduced to a certain level, which may be the case in office buildings with white collar people working alone, or at home, if the domestic computer perhaps is situated in the living room, or at any other location where other exterior considerations have to be dealt with.

According to another aspect of the invention, a method is envisaged, said method being employed with cooling system further comprising a pumping means with an impeller for pumping the cooling liquid through a pumping housing, said pumping means being driven by an AC electrical motor with a stator and a rotor, and said pumping means being provided with a means for sensing a position of the rotor, and wherein the method comprises the following steps: initially establishing a preferred rotational direction of the rotor of the electrical motor, before start of the electrical motor, sensing the angular position of the rotor, during start, applying an electrical AC voltage to the electrical motor and selecting the signal value, positive or negative, of the AC voltage at start of the electrical motor, said selection being made according to the preferred rotational direction, and said application of the AC voltage being performed by the computer system for applying the AC voltage from the electrical power supply of the computer system during conversions of the electrical DC voltage of the power supply to AC voltage for the electrical motor.

Adopting the above method according to the invention ensures the most efficient circulation of cooling liquid in the cooling system and at the same time ensures the lowest possible energy consumption of the electrical motor driving the impeller. The efficient circulation of the cooling liquid is obtained by means of an impeller being designed for rotation in one rotational direction only, thus optimising the impeller design with regard to the only one rotational direction as opposed to both rotational directions. The low energy consumption is achieved because of the impeller design being optimised, thus limiting the necessary rotational speed of the impeller for obtaining e certain amount of flow of the cooling liquid through the cooling system. A bonus effect of the lowest possible energy consumption being obtained is the lowest possible noise level of the pump also being obtained. The noise level of the pump is amongst other parameters also dependent on the design and the rotational speed of the impeller. Thus, an optimised impeller design and impeller speed will reduce the noise level to the lowest possible in consideration of ensuring a certain cooling capacity.

BRIEF DESCRIPTION OF THE FIGURES

The invention will hereafter be described with reference to the drawings, where

FIG. 4 is an exploded view of the invention and the surrounding elements.

FIG. 5 shows the parts shown in the previous figure when assembled and attached to the motherboard of a computer system.

DETAILED DESCRIPTION OF THE INVENTION

Figure 1:
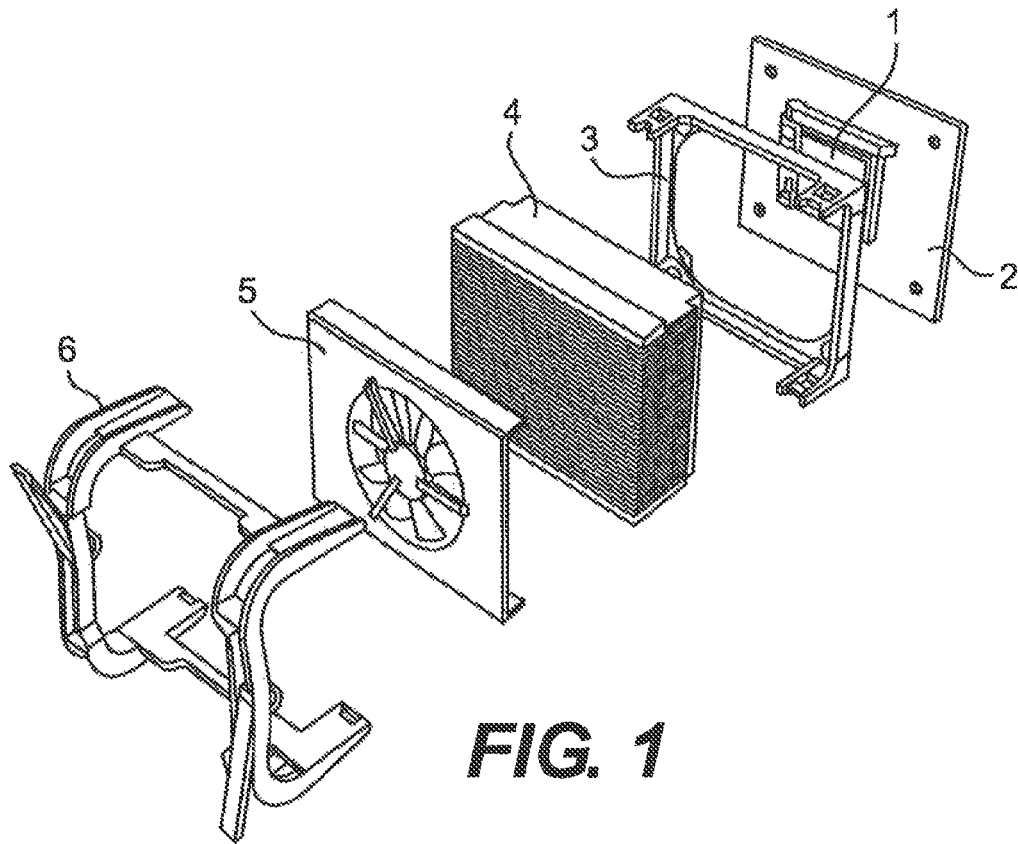
FIG. 1 shows an embodiment of the prior art. The figure shows the typical components in an air-cooling type CPU cooling arrangement.

FIG. 1 is an exploded view of an embodiment of prior art cooling apparatus for a computer system. The figure shows the typical components in an air-cooling type CPU cooling arrangement. The figure shows a prior art heat sink 4 intended for air cooling and provided with segments intersected by interstices, a prior art air fan 5 which is to be mounted on top of the heat sink by use of fastening means 3 and 6.

The fastening means comprises a frame 3 provided with holes intended for bolts, screws, rivets or other suitable fastening means (not shown) for thereby attaching the frame to a motherboard 2 of a CPU 1 or onto another processing unit of the computer system. The frame 3 is also provided with mortises provided in perpendicular extending studs in each corner of the frame, said mortises intended for taking up tenons of a couple of braces. The braces 6 are intended for enclosing the heat sink 4 and the air fan 5 so that the air fan and the heat sink thereby is secured to the frame. Using proper retention mechanisms, when the frame is attached to the motherboard of the CPU of other processing unit, and when the tenons of the braces are inserted into the mortises of the frame, the air fan and heat exchanger is pressed towards the CPU by using a force perpendicular to the CPU surface, said force being provided by lever arms.

Figure 2:
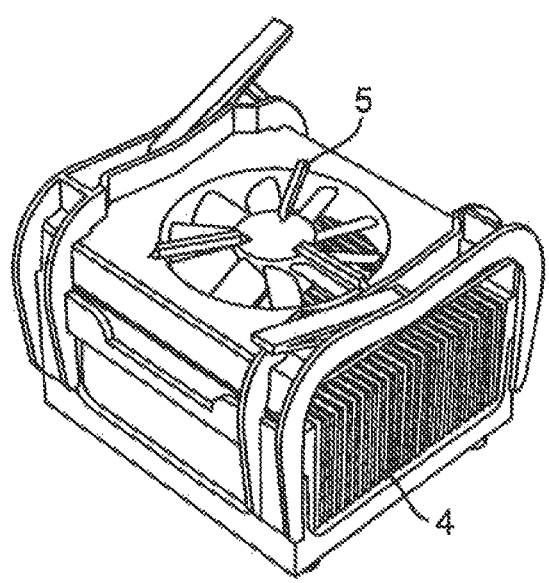
FIG. 2 shows an embodiment of the prior art. The figure shows the parts of the typical air-cooling type CPU cooling arrangement of FIG. 1 when assembled.

FIG. 2 shows the parts of the typical air-cooling type CPU cooling arrangement of FIG. 1, when assembled. The parts are attached to each other and will be mounted on top of a CPU on a motherboard (not shown) of a computer system.

Figure 3:
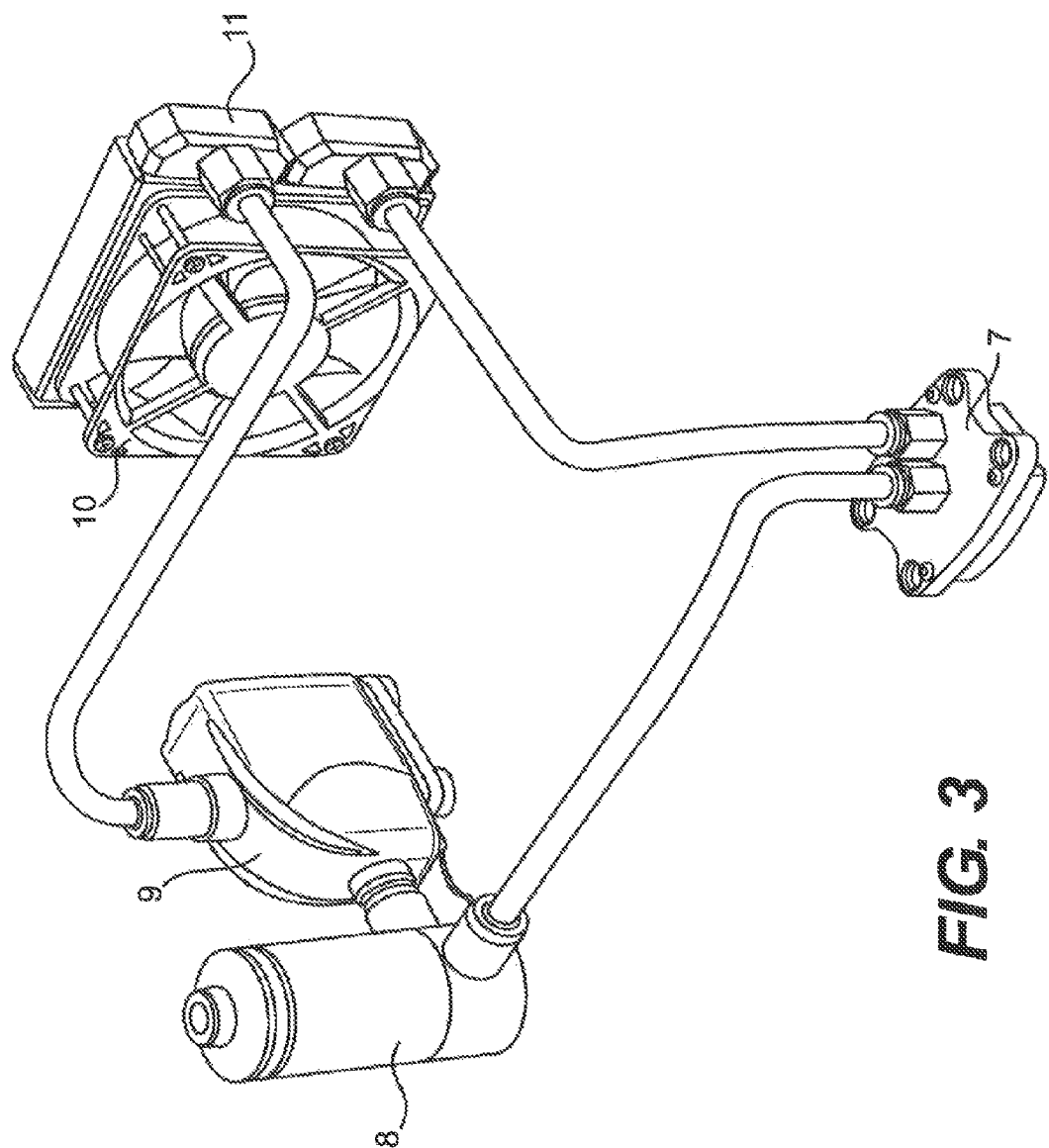
FIG. 3 shows an embodiment of the prior art. The figure shows the typical components in a liquid-cooling type CPU cooling arrangement.

FIG. 3 shows another embodiment of a prior art cooling system. The figure shows the typical components in a liquid-cooling type CPU cooling arrangement. The figure shows a prior art heat exchanger 7, which is in connection with a prior art liquid reservoir 8, a prior art liquid pump 9 and a heat radiator 11 and an air fan 10 provided together with the heat radiator. The prior art heat exchanger 7, which can be mounted on a CPU (not shown) is connected to a radiator and reservoir, respectively. The reservoir serves as a storage unit for excess liquid not capable of being contained in the remaining components. The reservoir is also intended as a means for venting the system of any air entrapped in the system and as a means for filling the system with liquid. The heat radiator 11 serves as a means for removing the heat from the liquid by means of the air fan 10 blowing air through the heat radiator. All the components are in connection with each other via tubes for conducting the liquid serving as the cooling medium.

FIG. 4 is an exploded view of a cooling system according to an embodiment of the invention. Also elements not being part of the cooling system as such are shown. The figure shows a central processing unit CPU 1 mounted on a motherboard of a computer system 2. The figure also shows a part of the existing fastening means, i.e. amongst others the frame 3 with mortises provided in the perpendicular extending studs in each corner of the frame. The existing fastening means, i.e. the frame 3 and the braces 6, will during use be attached to the motherboard 2 by means of bolts, screws, rivets or other suitable fastening means extending through the four holes provided in each corner of the frame and extending through corresponding holes in the motherboard of the CPU. The frame 3 will still provide an opening for the CPU to enable the CPU to extend through the frame.

The heat exchanging interface 4 is a separate element and is made of a heat conducting material having a relative high heat thermal conductivity such as copper or aluminium, and which will be in thermal contact with the CPU 1, when the cooling system is fastened to the motherboard 2 of the CPU. The heat exchanging surface constitutes part of a liquid reservoir housing 14, thus the heat exchanger 4 constitutes the part of the liquid reservoir housing facing the CPU. The reservoir may as example be made of plastic or of metal. The reservoir or any other parts of the cooling system, which are possibly manufactured from a plastic material may be "metallised" in order to minimise liquid diffusion or evaporation of the liquid. The metal may be provided as a thin layer of metal coating provided on either or on both of the internal side or the external side of the plastic part.

If the reservoir is made of metal or any other material having a relative high heat conductivity compared to as example plastic, the heat exchanging interface as a separate element may be excluded because the reservoir itself may constitute a heat exchanger over an area, wherein the reservoir is in thermal contact with the processing unit. Alternatively to having the heat exchanging interface constitute part of the liquid reservoir housing, the liquid reservoir housing may be tightly attached to the heat exchanging interface by means of screws, glue, soldering, brazing or the like means for securing the heat exchanging interface to the housing and vice versa, perhaps with a sealant 5 provided between the housing and the heat exchanging interface.

Alternatively to providing a heat exchanging interface integrate with the reservoir containing the cooling liquid, it will be possible to exclude the heat exchanger and providing another means for dissipating heat from the processing unit to the cooling liquid in the reservoir, The other means will be a hole provided in the reservoir, said hole intended for being directed towards the processing unit. Boundaries of the hole will be sealed towards boundaries of the processing unit or will be sealed on top of the processing unit for thereby preventing cooling liquid from the reservoir from leaking. The only prerequisite to the sealing is that a liquid-tight connection is provided between boundaries of the hole and the processing unit or surrounding of the processing unit, such as a carrier card of the processing unit.

By excluding the heat exchanger, a more effective heat dissipation will be provided from the processing unit and to the cooling liquid of the reservoir, because the intermediate element of a heat exchanger is eliminated. The only obstacle in this sense is the provision of a sealing being fluid-tight in so that the cooling liquid in the reservoir is prevented from leaking.

The heat exchanging surface 4 is normally a copper plate. When excluding the heat exchanging surface 4, which may be a possibility not only for the embodiments shown in FIG. 4, but for all the embodiments of the invention, it may be necessary to provide the CPU with a resistant surface that will prevent evaporation of the cooling liquid and/or any damaging effect that the cooling liquid may pose to the CPU. A resistant surface may be provided the CPU from the CPU producer or it may be applied afterwards. A resistant surface to be applied afterwards may e.g. be a layer, such as an adhesive tape provided on the CPU. The adhesive tape may be made with a thin metal layer e.g. in order to prevent evaporation of the cooling liquid and/or any degeneration of the CPU itself.

Within the liquid reservoir, a liquid pump (not shown) is placed for pumping a cooling liquid from an inlet tube 15 connection being attached to the housing of the reservoir through the reservoir and past the heat exchanger in thermal contact with the CPU to an outlet tube connection 16 also being attached to the reservoir housing. The existing fastening means comprising braces 6 with four tenons and the frame 3 with four corresponding mortises will fasten the reservoir and the heat exchanger to the motherboard of the CPU. When fastening the two parts of the existing fastening means to each other the fastening will by means of the lever arms 18 create a force to assure thermal contact between the CPU 1 mounted on the motherboard and the heat exchanger 4 being provided facing the CPU.

The cooling liquid of the cooling system may be any type of cooling liquid such as water, water with additives such as anti-fungicide, water with additives for improving heat conducting or other special compositions of cooling liquids such as electrically non-conductive liquids or liquids with lubricant additives or anti-corrosive additives.

FIG. 5 shows the parts shown in FIG. 4 when assembled and attached to the motherboard of a CPU of a computer system 2. The heat exchanger and the CPU is in close thermal contact with each other. The heat exchanger and the remainder of the reservoir 14 is fastened to the motherboard 2 by means of the existing fastening means being secured to the motherboard of the CPU and by means of the force established by the lever arms 18 of the existing fastening means. The tube inlet connection 15 and the tube outlet connection 16 are situated so as to enable connection of tubes to the connections.

Figure 6:
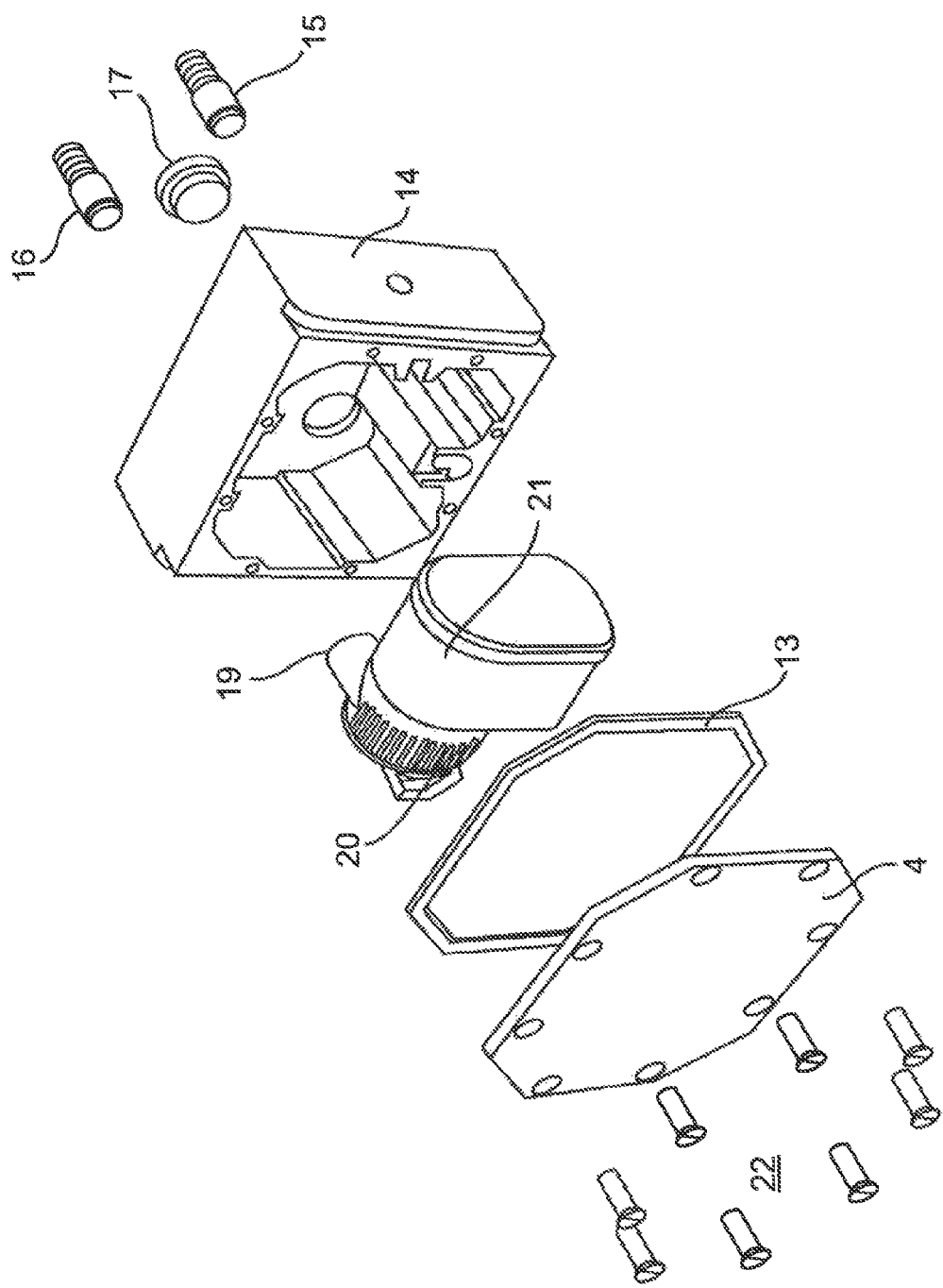
FIG. 6 is an exploded view of the reservoir from the previous FIGS. 4 and 5 seen from the opposite site and also showing the pump.

FIG. 6 is an exploded view of the reservoir shown in previous FIG. 4 and FIG. 5 and seen from the opposite site and also showing the pump 21 being situated inside the reservoir. Eight screws 22 are provided for attaching the heat exchanging surface 4 to the remainder of the reservoir. The heat exchanging surface is preferably made from a copper plate having a plane outer surface as shown in the figure, said outer surface being intended for abutting the free surface of the heat generating component such as the CPU (see FIG. 4). However, also the inner surface (not shown, see FIG. 7) facing the reservoir is plane. Accordingly, the copper plate need no machining other than the shaping of the outer boundaries into the octagonal shape used in the embodiment shown and drilling of holes for insertion of the bolts. No milling of the inner and/or the outer surface need be provided.

A sealant in form of a gasket 13 is used for the connection between the reservoir 14 and the heat exchanging surface forming a liquid tight connection. The pump is intended for being placed within the reservoir. The pump has a pump inlet 20 through which the cooling liquid flows from the reservoir and into the pump, and the pump has a pump outlet 19 through which the cooling liquid is pumped from the pump and to the outlet connection. The figure also shows a lid 17 for the reservoir. The non-smooth inner walls of the reservoir and the fact that the pump is situated inside the reservoir will provide a swirling of the cooling liquid inside the reservoir.

Figure 9:
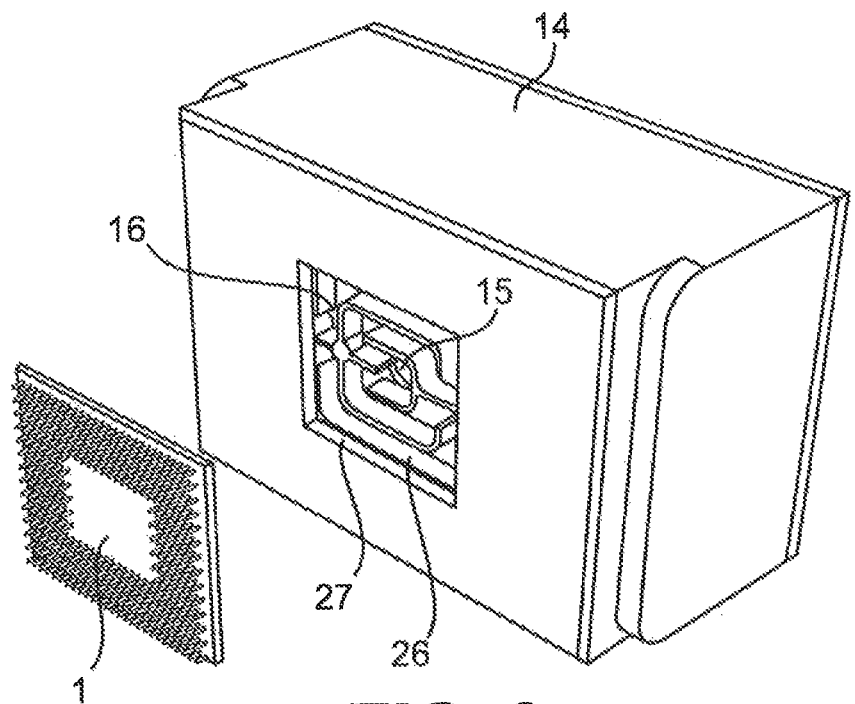
FIG. 9-10 are perspective views of a possible embodiment of reservoir housing providing direct contact between a CPU and a cooling liquid in a reservoir.
Figure 10:
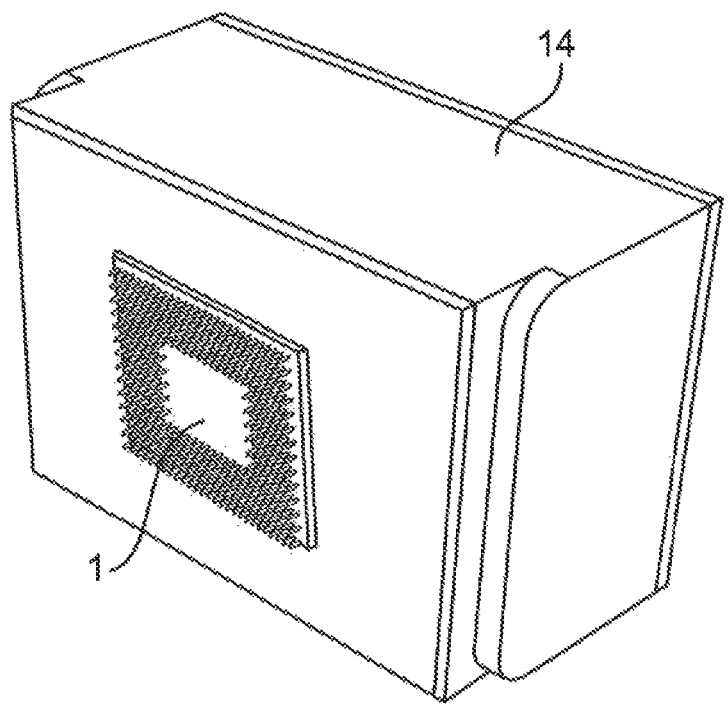
Figure 15:
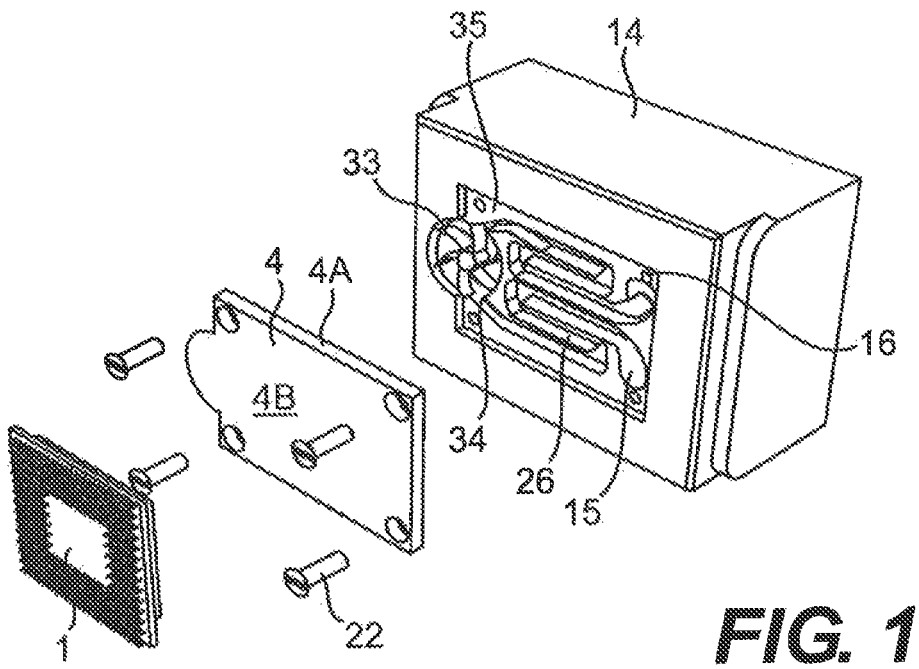
FIG. 15-16 are perspective view of a preferred embodiment of a reservoir and a pump and a heat exchanging surface constituting an integrated unit.

However, apart from the non-smooth walls of the reservoir and the pump being situated inside the reservoir, the reservoir may be provided with channels or segments for establishing a certain flow-path for the cooling liquid through the reservoir (see FIG. 9-10 and FIG. 15). Channel or segments are especially needed when the inner surface of the heat exchanging surface is plane and/or when the inner walls of the reservoir are smooth and/or if the pump is not situated inside the reservoir. In either of the circumstances mentioned, the flow of the cooling liquid inside the reservoir may result in the cooling liquid passing the reservoir too quickly and not being resident in the reservoir for a sufficient amount of time to take up a sufficient amount of heat from the heat exchanging surface. By providing channels or segments inside the reservoir, a flow will be provided forcing the cooling liquid to pass the heat exchanging surface, and the amount of time increased of the cooling liquid being resident inside the reservoir, thus enhancing heat dissipation. If channels or segments are to be provided inside the reservoir, the shape and of the channels and segments may be decisive of whether the reservoir is to be made of plastic, perhaps by injection moulding, or is to be made of metal such as aluminium, perhaps by die casting.

The cooling liquid enters the reservoir through the tube inlet connection 15 and enters the pump inlet 20, and is pumped out of the pump outlet 19 connected to the outlet connection 16. The connection between the reservoir and the inlet tube connection and the outlet tube connection, respectively, are made liquid tight. The pump may not only be a self-contained pumping device, but may be made integrated into the reservoir, thus making the reservoir and a pumping device one single integrated component. This single integrated element of the reservoir and the pumping device may also be integrated, thus making the reservoir, the pumping device and the heat exchanging surface one single integrated unit. This may as example be possible if the reservoir is made of a metal such as aluminium. Thus, the choice of material provides the possibility of constituting both the reservoir and a heat exchanging surface having a relatively high heat conductivity, and possibly also renders the possibility of providing bearings and the like constructional elements for a motor and a pumping wheel being part of the pumping device. In an alternative embodiment, the pump is placed in immediate vicinity of the reservoir, however outside the reservoir. By placing the pump outside, but in immediate vicinity of the reservoir, still an integrate element may be obtained, The pump or the inlet or the outlet is preferably positioned so as to obtain a turbulence of flow in the immediate vicinity of the heat exchanging interface, thereby promoting increased heat dissipation between the heat exchanging interface end the cooling liquid. even in the alternative, a pumping member such as an impeller (see FIG. 15-16) may be provided in the immediate vicinity of the heat exchanging surface. The pumping member itself normally introduces a turbulence of flow, and thereby the increased heat dissipation is promoted irrespective of the position of the pump itself, or the position of the inlet or of the outlet to the reservoir or to the pump.

The pump may be driven by an AC or a DC electrical motor. When driven by an AC electrical motor, although being technically and electrically unnecessary in a computer system, this may be accomplished by converting part of the DC electrical power of the power supply of the computer system to AC electrical power for the pump. The pump may be driven by an electrical motor at any voltage common in public electrical networks such as 110V or 220V. However, in the embodiment shown, the pump is driven by a 12V AC electrical motor.

Control of the pump in case the pump is driven by an AC electrical motor, preferably takes place by means of the operative system or an alike means of the computer system itself, and where the computer system comprises means for measuring the CPU load and/or the CPU temperature. Using the measurement performed by the operative system or alike system of the computer system eliminates the need for special means for operating the pump. Communication between the operative system or alike system and a processor for operating the pump may take place along already established communication links in the computer system such as a USB-link. Thereby, a real-time communication between the cooling system and the operative system is provided without any special means for establishing the communication. In the case of the motor driving the pump is an AC electrical motor, the above method of controlling the pump may be combined with a method, where said pumping means is provided with a means for sensing a position of the rotor of the electrical motor, and wherein the following steps are employed: Initially establishing a preferred rotational direction of the rotor of the electrical motor, before start of the electrical motor, sensing the angular position of the rotor, during start, applying an electrical AC voltage to the electrical motor and selecting the signal value, positive or negative, of the AC voltage at start of the electrical motor, said selection being made according to the preferred rotational direction, and said application of the AC voltage being performed by the computer system for applying the AC voltage from the electrical power supply of the computer system during conversion of the electrical DC voltage of the power supply to AC voltage for the electrical motor. By the operative system of the computer system itself generating the AC voltage for the electrical motor, the rotational direction of the pump is exclusively selected by the computer system, non-depending on the applied voltage of the public grid powering the computer system.

Further control strategies utilising the operative system or alike system of the computer system may involve balancing the rotational speed of the pump as a function of the cooling capacity needed. If a lower cooling capacity is needed, the rotational speed of the pump, may be limited, thereby limiting the noise generating by the motor driving the pump.

In the case an air fan is provided in combination with a heat sink as shown in FIG. 1, of the air fan is provided in combination with the heat radiator, the operative system or alike system of the computer system may be designed for regulating the rotational speed of the pump, and thus of the motor driving the pump, and the rotational speed of the air fan, and thus the motor driving the air fan. The regulation will take into account the cooling capacity needed, but the regulation will at the same time take into account which of the two cooling means, i.e. the pump and the air fan, is generating the most noise. Thus, it the air fan generally is generating more noise than the pump, then the regulation will reduce the rotational speed of the air fan before reducing the rotational speed of the pump, whenever a lower cooling capacity is needed. Thereby, the noise level of the entire cooling system is lowered as much as possible. If the opposite is the case, i.e. the pump generally generating more noise than the air fan, then the rotational speed of the pump will be reduced before reducing the rotational speed of the air fan. Even further control strategies involve controlling the cooling capacity in dependence on the type of computer processing taking place. Some kind of computer processing, such as word-processing, applies a smaller load on the processing units such as the CPU than other kinds of computer processing, such as image processing. Therefore, the kind of processing taking place on the computer system may be used as an indicator of the cooling capacity. It may even be possible as part of the operative system or similar system to establish certain cooling scenarios, depending on the kind of processing intended by the user. If the user selects as example word-processing, a certain cooling strategy is applied based on a limited need for cooling. If the user selects as example image-processing, a certain cooling strategy is applied based on an increased need for cooling. Two or more different cooling scenarios may be established depending on the capacity and the control possibilities and capabilities of the cooling system and depending on the intended use of the computer system, either as selected by a user during use of the computer system or as selected when choosing hardware during build-up of the computer system, i.e. before actual use of the computer system.

The pump is not being restricted to a mechanical device, but can be in any form capable of pumping the cooling liquid through the system. However, the pump is preferably one of the following types of mechanical pumps: Bellows pump, centrifugal pump, diaphragm pump, drum pump, flexible liner pump, flexible impeller pump, gear pump, peristaltic tubing pump, piston pump, processing cavity pump, pressure washer pump, rotary lobe pump, rotary vane pump and electro-kinetic pump. Similarly, the motor driving the pumping member need not be electrical but may also be a piezo-electrically operated motor, a permanent magnet operated motor, a fluid-operated motor or a capacitor-operated motor. The choice of pump and the choice of motor driving the pump id dependent on many different parameters, and it is up to the person skilled in the art to choose the type of pump and the type of motor depending on the specific application. As example, some pumps and some motors are better suited for small computer systems such as lab-tops, some pumps and some motors are better suited for establishing i high flow of the cooling liquid and thus a high cooling effect, and even some pumps and motors are better suited for ensuring a low-noise operation of the cooling system.

Figure 7:
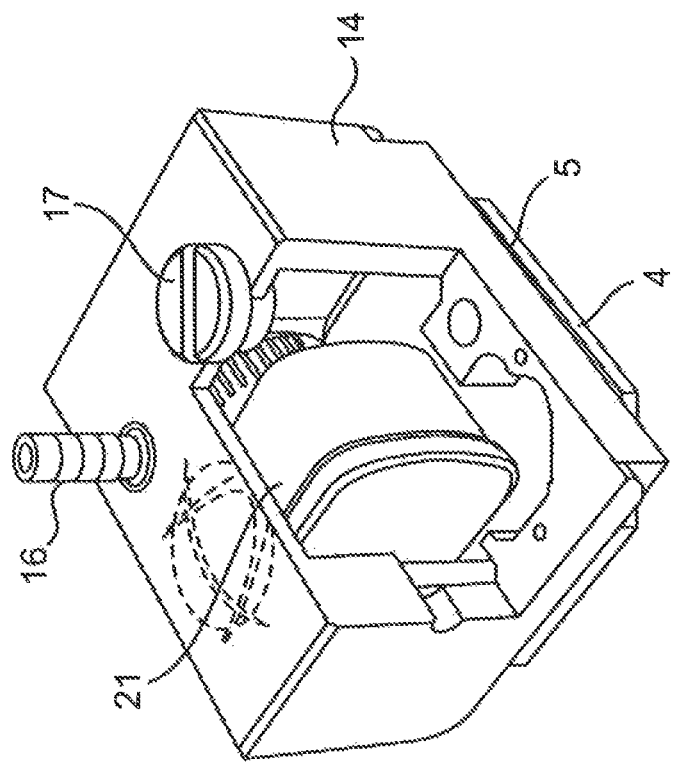
FIG. 7 is a cut-out view into the reservoir housing the pump and an inlet and an outlet extending out of the reservoir.

FIG. 7 is a cut-out view into the reservoir, when the reservoir and the heat exchanging surface 4 is assembled and the pump 21 is situated inside the reservoir. The reservoir is provided with the tube inlet connection (not seen from the figure) through which the cooling liquid enters the reservoir. Subsequently, the cooling liquid flows through the reservoir passing the heat exchanging surface and enters the inlet of the pump. After having been passed through the pump, the cooling liquid is passed out of the outlet of the pump and further out through the tube outlet connection 16. The figure also shows a lid 17 for the reservoir. The flow of the cooling liquid inside the reservoir and trough the pump may be further optimised in order to use as little energy as possible for pumping the cooling liquid, but still having a sufficient amount of heat from the heat exchanging surface being dissipated in the cooling liquid. This further optimisation can be established by changing the length and shape of the tube connection inlet within the reservoir, and/or by changing the position of the pump inlet, and/or for instance by having the pumping device placed in the vicinity and in immediate thermal contact with the heat exchanging surface and/or by providing channels or segments inside the reservoir.

In this case, an increased turbulence created by the pumping device is used to improve the exchange of heat between the heat exchanging surface and the cooling liquid. Another or an additional way of improving the heat exchange is to force the cooling liquid to pass through specially adapted channels or segments being provided inside the reservoir or by making the surface of the heat exchanging surface plate inside the reservoir uneven or by adopting a certain shape of a heat sink with segments. In the figure shown, the inner surface of the heat exchanging surface facing the reservoir is plane.

Figure 8:
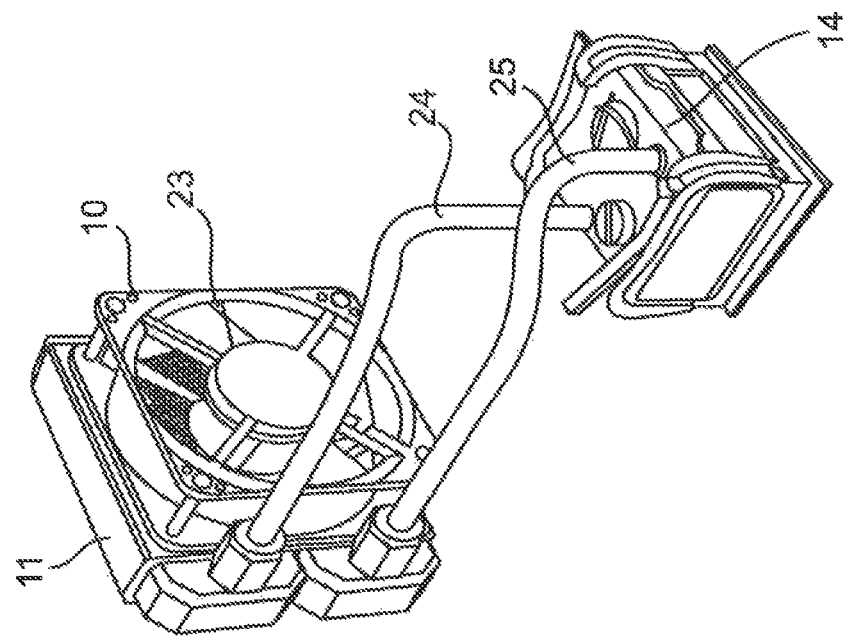
FIG. 8 is a view of the cooling system showing the reservoir connected to the heat radiator.

FIG. 8 is a perspective view of the cooling system showing the reservoir 14 with the heat exchanging surface (not shown) and the pump (not shown) inside the reservoir. The tube inlet connection and the tube outlet connection are connected to a heat radiator by means of connecting tubes 24 and 25 through which the cooling liquid flows into and out of the reservoir and the heat radiator, respectively. Within the heat radiator 11, the cooling liquid passes a number of channels for radiating the heat, which has been dissipated into the cooling liquid inside the reservoir, and to the surroundings of the heat exchanger. The air fan 10 blows air past the channels of the heat radiator in order to cool the radiator and thereby cooling the cooling liquid flowing inside the channels through the heat radiator and back into the reservoir. According to the invention, the heat radiator 11 may be provided alternatively. The alternative heat radiator is constituted by a heat sink, such as a standard heat sink made of extruded aluminium with fins on a first side and a substantially plane second side. An air-fan may be provided in connection with the fins along the first side. Along the second side of the heat sink a reservoir is provided with at least one aperture intended for being closed by placing said aperture covering part of, alternatively covering the whole of, the substantial plane side of the heat sink. When closing the reservoir in such a way a surface of the heat sink is in direct heat exchanging contact with an interior of the reservoir, and thus in direct heat exchanging contact with the cooling liquid in the reservoir, through the at least one aperture. This alternative way of providing the heat radiator may be used in the embodiment shown in FIG. 8 or may be used as a heat radiator for another use and/or for another embodiment of the invention.

A pumping means for pumping the cooling liquid trough the reservoir may or may not be provided inside the reservoir at the heat sink. The reservoir may be provided with channels or segments for establishing a certain flow-path for the cooling liquid through the reservoir. Channels or segments are especially needed when the inner surface of the heat exchanging surface is plane and/or when the inner walls of the reservoir are smooth and/or if the pump is not situated inside the reservoir. In either of the circumstances mentioned, the flow of the cooling liquid inside the reservoir may result in the cooling liquid passing the reservoir too quickly and not being resident in the reservoir for a sufficient amount of time to take up a sufficient amount of heat from the heat exchanging surface. If channels or segments in the reservoir are to be provided inside the reservoir, the shape and of the channels and segments may be decisive of whether the reservoir is to be made of plastic, perhaps by injection moulding, or is to be made of metal such as aluminium, perhaps by die casting.

By means of the alternative heat radiator, the heat radiator 11 is not provided as is shown in the figure with the rather expensive structure of channels leading the cooling liquid along ribs connecting the channels for improved surface of the structure. Instead, the heat radiator is provided as described as a unit constituted by a heat sink with or without a fan and a reservoir, and thereby providing a simpler and thereby cheaper heat radiator than the heat radiator 11 shown in the figure.

The alternative heat radiator provided as an unit constituted by a heat sink and a reservoir, may be used solely, with or without a pump inside the reservoir and with or without the segments or channels, for being placed in direct or indirect thermal contact with a heat generating processing unit such as CPU or with the heat exchanging surface, respectively. These embodiments of the invention may e.g. be used for a reservoir, where the cooling liquid along a first side within the reservoir is in direct heat exchanging contact with the heat generating processing unit such as a CPU and the cooling liquid along a second side within the reservoir is in direct heat exchanging contact with a heat sink. Such a reservoir may be formed such as to provide a larger area of heat exchanging surface towards the heat generating processing unit such as a CPU than the area of the heat exchanging surface facing the heat sink. This may e.g. have the purpose of enlarging the area of the heat exchanging surface so as to achieve an improved heat dissipation form e.g. the CPU to the heat sink than that of a conventional heat sink without a reservoir attached. Conventional heat sinks normally only exchanges heat with the CPU through the area as given by the area of the top side of the CPU. A system comprising a liquid reservoir and a heat sink with a fan provided has been found to be a simple, cost optimised system with an improved heat dissipation than that of a standard heat sink with a fan, but without the reservoir. In another embodiment of the invention, which may be derived from FIG. 8, the air fan and the heat radiator is placed directly in alignment of the reservoir. Thereby, the reservoir 14, the air fan 10 and the radiator 11 constitute an integrate unit. Such an embodiment may provide the possibility of omitting the connection tubes, and passing the cooling liquid directly from the heat radiator to the reservoir via an inlet connection of the reservoir, and directly from the reservoir to the heat radiator via an outlet connection of the reservoir. Such an embodiment may even render the possibility of both the pumping device of the liquid pump inside the reservoir and the electrical motor for the propeller of the air fan 23 of the heat radiator 11 being driven by the same electrical motor, thus making this electrical motor the only motor of the cooling system. When placing the heat radiator on top of the air fan now placed directly in alignment with the reservoir and connecting the heat radiator directly to the inlet connection and outlet connection of the reservoir, a need for tubes will not be present. However, if the heat radiator and the reservoir is not in direct alignment with each other, but tubes may still be needed, but rather than tubes, pipes made of metal such as copper or aluminium may be employed, such pipes being impervious to any possible evaporation of cooling liquid. Also, the connections between such pipes and the heat radiator and the reservoir, respectively, may be soldered so that even the connections are made impervious to evaporation of cooling liquid.

In the derived embodiment just described, an integrated unit of the reservoir, the heat exchanging surface and the pumping device will be given a structure establishing improved heat radiating characteristics because the flow of air of the air fan may also be directed along outer surfaces of the reservoir. If the reservoir is made of a metal, the metal will be cooled by the air passing the reservoir after having passed or before passing the heat radiator. If the reservoir is made of metal, and if the reservoir is provided with segments on the outside surface of the reservoir, such cooling of the reservoir by the air will be further improved. Thereby, the integrated unit just described will be applied improved heat radiating characteristics, the heat radiation function normally carried out by the heat radiator thus being supplemented by one or more of the further elements of the cooling system, i.e. the reservoir, the heat exchanging surface, the liquid pump and the air fan.

FIG. 9-10 show an embodiment of a reservoir housing 14, where channels 25 are provided inside the reservoir for establishing a forced flow of the cooling liquid inside the reservoir. The channels 25 in the reservoir 14 lead from an inlet 15 to an outlet 16 like a maze between the inlet and the outlet. The reservoir 14 is provided with an aperture 27 having outer dimensions corresponding to the dimensions of a free surface of the processing unit 1 to be cooled. In the embodiment shown, the processing unit to be cooled is a CPU 1.

When channels 26 are provided inside the reservoir, the shape of the channels may be decisive of whether the reservoir is to be made of plastic, perhaps manufactured by injection moulding, or is to be made of metal such as aluminium, perhaps manufactured by extrusion or by die casting.

The reservoir 14 or any other parts of the cooling system, which are possibly manufactured from a plastic material may be "metallised" in order to minimise liquid diffusion or evaporation of the liquid. The metal may be provided as a thin layer of metal coating provided on either or on both of the internal side or the external side of the plastic part. The CPU 1 is intended for being positioned in the aperture 27, as shown in FIG. 10, so that outer boundaries of the CPU are engaging boundaries of the aperture. Possibly, a sealant (not shown) may be provided along the boundaries of the CPU and the aperture for ensuring a fluid tight engagement between the boundaries of the CPU and the boundaries of the aperture. When the CPU 1 is positioned in the aperture 27, the free surface (not shown) of the CPU is facing the reservoir, i.e. the part of the reservoir having the channels provided. Thus, when positioned in the aperture 27 (see FIG. 10), the free surface of the CPU 1 is having direct contact with cooling liquid flowing through the channels 26 in the reservoir.

When cooling liquid is forced from the inlet 15 along the channels 26 to the outlet 16, the whole of the free surface of the CPU 1 will be passed over by the cooling liquid, thus ensuring a proper and maximised cooling of the CPU. The configuration of the channels may be designed and selected according to any one or more provisions, i.e. high heat dissipation, certain flow characteristics, ease of manufacturing etc. Accordingly, the channels may have another design depending on any desire or requirement and depending on the type of CPU and the size and shape of the free surface of the CPU. Also, other processing units than a CPU may exhibit different needs for heat dissipation, and may exhibit other sizes and shapes of the free surface, leading to a need for other configurations of the channels. If the processing unit is very elongate, such as a row of microprocessors, one or a plurality of parallel channels may be provided, perhaps just having a common inlet and a common outlet.

Figure 11:
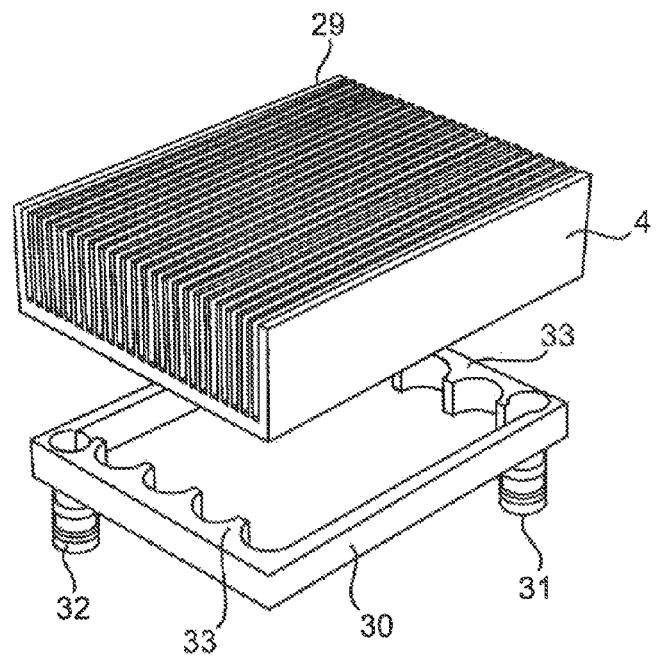
FIG. 11-13 are perspective views of a possible embodiment of heat sink and a reservoir housing constituting an integrated unit.
Figure 12:
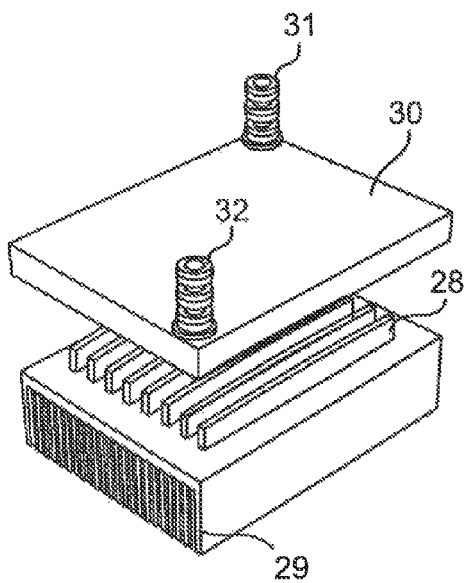
Figure 13:
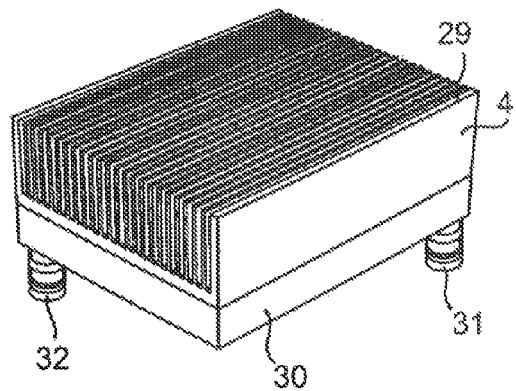

FIG. 11-13 show an embodiment of a heat sink 4, where segments 28 are provided at a first side 4A of the heat sink, and fins 29 for dissipating heat to the surroundings are provided at the other, second side 4B of the heat sink. An intermediate reservoir housing 30 is provided having a recessed reservoir at the one side facing the first side 4A of the heat sink. The recessed reservoir 30 has an inlet 31 and an outlet 32 at the other side opposite the side facing the heat sink 4.

When segments 28 are provided on the first side 4A of the heat sink, the shape of the segments may be decisive of whether the reservoir, which is made from metal such as aluminium or copper, is to be made by extrusion or is to be made by other manufacturing processes such as die casting. Especially when the segments 28 are linear and are parallel with the fins 29, as shown in the embodiment, extrusion is a possible and cost-effective means of manufacturing the heat sink 4.

The intermediate reservoir 30 or any other parts of the cooling system, which are possibly manufactured from a plastic material may be "metallised" in order to minimise liquid diffusion or evaporation of the liquid. The metal may be provided as a thin layer of metal coating provided on either or on both of the internal side or the external side of the plastic part. The recessed reservoir is provided with a kind of serration 33 along opposite sides of the reservoir, and the inlet 31 and the outlet 32, respectively, are provided at opposite corners of the intermediate reservoir 30. The segments 28 provided at the first side 4A of the heat sink, i.e. the side facing the intermediate reservoir 30, are placed so that when the heat sink is assembled with the intermediate reservoir housing (see FIG. 13) the segments 29 run from one serrated side of the reservoir to the other serrated side of the reservoir.

When cooling liquid is forced from the inlet 31 through the reservoir, along channels (not shown) formed by the segments 29 of the heat sink 4 and to the outlet 32, the whole of the first side 4A of the heat sink will be passed over by the cooling liquid, thus ensuring a proper and maximised heat dissipation between the cooling liquid and the heat sink. The configuration of the segments on the first side 4A of the heat sink and the configuration of the serrated sides of the intermediate reservoir housing may be designed and selected according to any provisions. Accordingly, the segments may have another design, perhaps being wave-shaped or also a serrated shape, depending on any desired flow characteristics of the cooling liquid and depending on the type of heat sink and the size and shape of the reservoir.

Also other types of heat sinks, perhaps circular shaped heat sinks may exhibit different needs for heat dissipation, may exhibit other sizes and shapes of the free surface, leading to a need for other configurations of the segments and the intermediate reservoir. If the heat sink and the reservoir are circular or oval, a spiral-shaped segmentation or radially extending segments may be provided, perhaps having the inlet or the outlet in the centre of the reservoir. If an impeller of the pump is provided, as shown in FIG. 15-16, the impeller of the pump may be positioned in the centre of a spiral-shaped segmentation or in the centre of radially extending segments.

Figure 14:
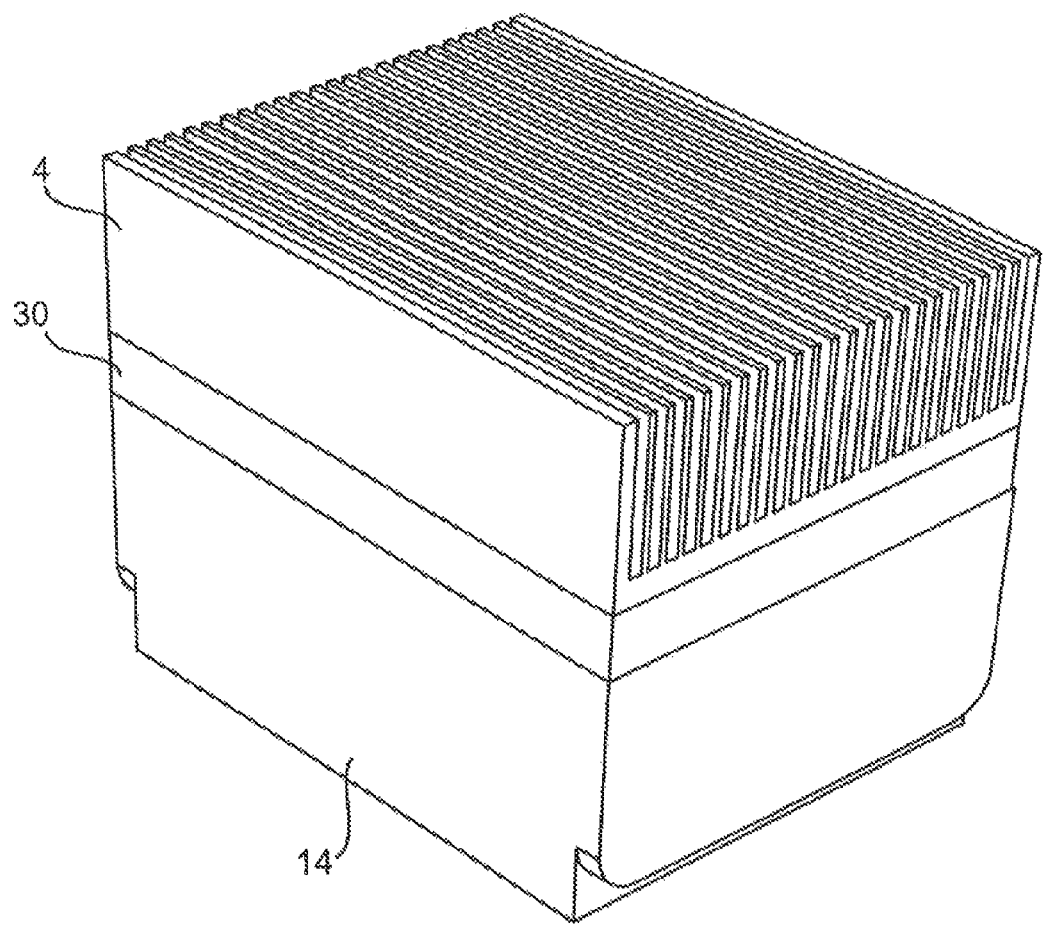
FIG. 14 is a perspective view of the embodiment shown in FIG. 9-10 and the embodiment shown in FIG. 11-13 all together constituting an integrated unit.

FIG. 14 shows the reservoir 14 shown in FIG. 9-10 and the heat sink 4 and the intermediate reservoir 30 shown in FIG. 11-13 being assembled for thereby constituting an integrated monolithic unit. It is not absolutely necessary to assemble the reservoir 14 of FIG. 9-10 and the heat sink 4 and the intermediate reservoir 30 of FIG. 11-13 in order to obtain a properly functioning cooling system. The inlet 15 and the outlet 16 of the reservoir 14 of FIG. 9-10 may be connected to the outlet 32 and the inlet 31, respectively, of the intermediate reservoir of FIG. 11-13 by means of tubes or pipes.

The reservoir 14 of FIG. 9-10 and the heat sink 4 and the intermediate reservoir 30 of FIG. 11-13 may then be positioned in the computer system at different locations. However, by assembling the reservoir 14 of FIG. 9-10 and the heat sink 4 and the intermediate reservoir 30 of FIG. 11-13 a very compact monolithic unit is obtained, also obviating the need for tubes or pipes. Tubes or pipes may involve an increased risk of leakage of cooling liquid or may require soldering or other special working in order to eliminate the risk of leakage of cooling liquid. By eliminating the need for tubes or pipes, any leakage and any additional working is obviated when assembling the cooling system.

Figure 16:
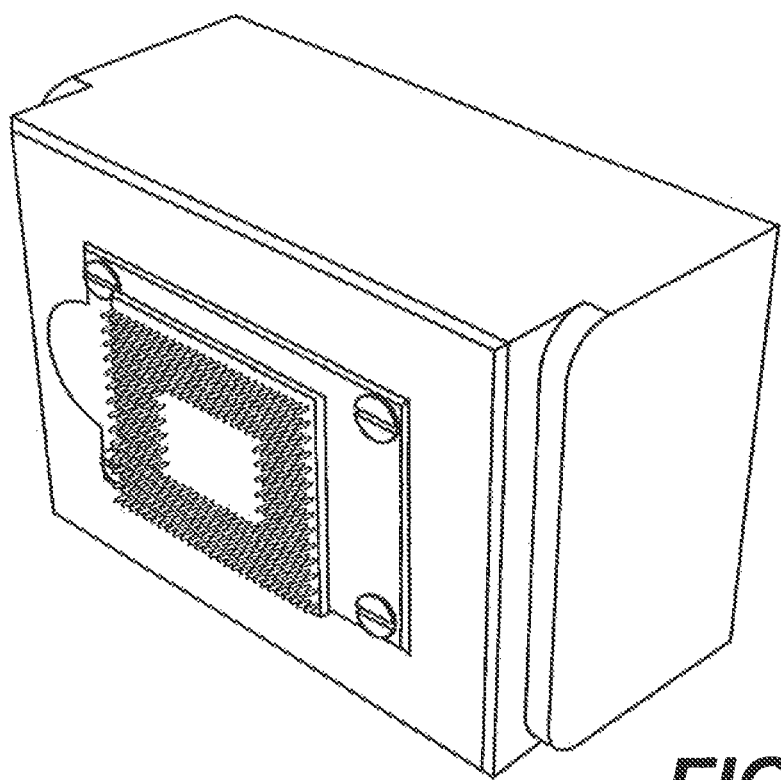

FIG. 15-16 show a possible embodiment of a reservoir according to the invention. The reservoir is basically similar to the reservoir shown in FIG. 9-10. However, an impeller 33 of the pump of the cooling system is provided in direct communication with the channels 26. Also, in the embodiment shown, a heat exchanging interface 4 such as a surface made from a copper plate, alternatively a plate of another material having a high thermal conductivity, is placed between the channels 26 inside the reservoir and the CPU 1 as the processing unit.

The heat exchanging surface 4 is preferably made from a copper plate having a plane outer surface as shown in the figure, said outer surface being intended for abutting the free surface of the heat generating component such as the CPU 1 (see FIG. 4). However, also the inner surface (not shown, see FIG. 7) facing the reservoir is plane. Accordingly, the copper plate need no machining other than the shaping of the outer boundaries into the specially adapted shape used in the embodiment shown and drilling of holes for insertion of the bolts. No milling of the inner and/or the outer surface need be provided.

The provision of the heat exchanging surface 4 need not be a preferred embodiment, seeing that the solution incorporating the aperture (see FIG. 9-10) result in a direct heat exchange between the free surface of the CPU or other processing unit and the cooling liquid flowing along the channels in the reservoir. However, the heat exchanging surface enables usage of the cooling system independently on the type and size of the free surface of CPU or other processing unit.

In the embodiment shown, the heat exchanging surface 4 is secured to the reservoir by means of bolts 22. Other convenient fastening means may be used. The heat exchanging surface 4 and thus the reservoir 14 may be fastened to the CPU 1 or other processing unit by any suitable means such as soldering, brazing or by means of thermal paste combined with glue. Alternatively, special means (not shown) may be provided for ensuring a thermal contact between the free surface of the CPU or other processing unit and the heat exchanging surface. One such means may be the fastening means shown in FIG. 4 and FIG. 5 or similar fastening means already provided as part of the computer system.

When channels 26 are provided inside the reservoir 14, the shape of the channels may be decisive of whether the reservoir is to be made of plastic, perhaps by injection moulding, or is to be made of metal such as aluminium, perhaps by die casting.

The reservoir 14 or any other parts of the cooling system, which are possibly manufactured from a plastic material may be "metallised" in order to minimise liquid diffusion or evaporation of the liquid. The metal may be provided as a thin layer of metal coating provided on either or on both of the internal side or the external side of the plastic part. The impeller 33 (see FIG. 14) of the pump is positioned in a separate recess of the channels 26, said separate recess having a size corresponding to the diameter of the impeller of the pump. The recess is provided with an inlet 34 and an outlet 35 being positioned opposite an inlet 31 and an outlet 32 of cooling liquid to and from, respectively, the channels 26. The impeller 33 of the pump has a shape and a design intended only for one way rotation, in the embodiment shown a clock-wise rotation only. Thereby, the efficiency of the impeller of the pump is highly increased compared to impellers capable of and intended for both clock-wise and counter clock-wise rotation.

The increased efficiency of the impeller design results in the electric motor (not shown) driving the impeller of the pump possibly being smaller than otherwise needed for establishing a proper and sufficient flow of cooling liquid through the channels. In a preferred embodiment, the electric motor is an AC motor, preferably a 12V AC motor, leading to the possibility of an even smaller motor needed for establishing the proper and sufficient flow of cooling liquid through the channels.

The impeller of the pump may be driven by an AC or a DC electrical motor. However, as mentioned, preferably the impeller of the pump is driven by an AC electrical motor. Although being technically and electrically unnecessary to use an AC electrical motor in a computer system, this may be accomplished by converting part of the DC electrical power of the power supply of the computer system to AC electrical power for the impeller of the pump. The impeller may be driven by an electrical motor at any voltage common in public electrical networks such as 110V or 220V. However, in the embodiment shown, the impeller of the pump is driven by a 12V electrical motor.

The invention has been described with reference to specific embodiments and with reference to specific utilisation, it is to be noted that the different embodiments of the invention may be manufactured, marketed, sold and used separately or jointly in any combination of the plurality of embodiments. In the above detailed description of the invention, the description of one embodiment, perhaps with reference to one or more figures, may be incorporated into the description of another embodiment, perhaps with reference to another or more other figures, and vice versa. Accordingly, any separate embodiment described in the text and/or in the drawings, or any combination of two or more embodiments is envisaged by the present application.

I claim:

1. A cooling system for a computer system processing unit, comprising:
   a reservoir configured to circulate a cooling liquid therethrough, the reservoir including:
   an upper chamber and a lower chamber, wherein the upper chamber and the lower chamber are vertically displaced separate fluid-containing receptacles that are each surrounded by boundary walls, wherein at least one of the boundary walls separate the upper chamber from the lower chamber, a first passage and a second passage being positioned on the boundary wall, the first passage being a passage that directs the cooling liquid from the upper chamber to the lower chamber and the second passage being a passage that directs the cooling liquid from the lower chamber, wherein the first passage directs the cooling liquid into a middle of the lower chamber where it is directed along a plurality of channels from the middle of the lower chamber out toward a second passage positioned at a perimeter of the lower chamber wherein the cooling liquid comes together and is directed from the lower chamber;

a heat exchanging interface attached to the reservoir to form a boundary wall of the lower chamber, the heat exchanging interface provides separable thermal contact between the processing unit and the cooling liquid;

a centrifugal pump having a motor and an impeller, the impeller being positioned within the upper chamber of the reservoir; and a radiator spaced apart from and fluidly coupled to the reservoir.

2. The cooling system of claim 1, further including a control system, wherein the control system is configured to adjust a speed of the pump.

3. The cooling system of claim 2, wherein the control system is part of an operating system of the computer.

4. The cooling system of claim 2, wherein the control system is configured to measure one of an operating load or an operating temperature of the processing unit and adjust the pump based on the measured value.

5. The cooling system of claim 2, wherein the control system is configured to determine a required cooling capacity of the cooling system and adjust a rotational speed of the pump based on the required cooling capacity.

6. The cooling system of claim 5, wherein the control system is configured to reduce the rotational speed of the pump if lower cooling capacity is required.

7. The cooling system of claim 2, wherein the control system is configured to adjust a rotational speed of a fan and a rotational speed of the pump to reduce noise and provide a required cooling capacity of the cooling system.

8. The cooling system of claim 2, wherein at least one of the first passage and second passage has a substantially circular shape.

9. A cooling system for a processing unit positioned on a motherboard of a computer, comprising:
   a reservoir configured to be coupled to the processing unit positioned on the motherboard at a first location, the reservoir being adapted to pass a cooling liquid therethrough, wherein the reservoir includes an upper chamber and a lower chamber, the upper chamber and the lower chamber being separate cooling liquid containing receptacles that are vertically spaced apart and separated by at least a boundary wall, the upper chamber and the lower chamber being connected together by a first passage and a second passage, the first passage being a passage that directs the cooling liquid from the upper chamber to the lower chamber and the second passage being a passage that directs the cooling liquid from the lower chamber, wherein the first passage directs the cooling liquid into a middle of the lower chamber where it is directed along a plurality of channels from the middle of the lower chamber out toward a second passage positioned at a perimeter of the lower chamber where the cooling liquid comes together and is directed from the lower chamber, the reservoir further including a heat exchanging interface configured to be placed in thermal contact with the processing unit, the heat exchanging interface being attached to the reservoir such that the heat exchanging interface forms a boundary wall of the lower chamber of the reservoir;
   a radiator fluidly coupled to the reservoir and configured to be positioned at a second location spaced apart from the first location when the reservoir is coupled to the processing unit;
   a fan adapted to direct air to the radiator to dissipate heat from the cooling liquid to surrounding atmosphere;
   a pump configured to circulate the cooling liquid between the reservoir and the radiator, the pump including a motor having a rotor, a stator, and an impeller, the impeller being positioned in the upper chamber of the reservoir; and
   a control system configured to adjust a rotation speed of the pump.

10. The cooling system of claim 9, wherein the control system is configured to adjust the rotation speed based on a temperature of the processing unit.

11. The cooling system of claim 9, wherein the control system is configured to select a rotational direction of the impeller.

12. The cooling system of claim 9, wherein the control system is configured to adjust a speed of the fan independent of a speed of the pump.

13. A cooling system for a computer system processing unit, comprising:
   a reservoir configured to circulate a cooling liquid therethrough, the reservoir including:
      an upper chamber and a lower chamber, wherein the upper chamber and the lower chamber are vertically displaced separate fluid-containing receptacles that are each surrounded by boundary walls, wherein at least one of the boundary walls separate the upper chamber from the lower chamber,
      a first passage and a second passage being positioned on the boundary wall, the first passage being a passage that directs the cooling liquid from the upper chamber to the lower chamber and the second passage being a passage that directs the cooling liquid from the lower chamber to the upper chamber;
   a heat exchanging interface attached to the reservoir to form a boundary wall of the lower chamber, the heat exchanging interface provides thermal contact between the processing unit and the cooling liquid;
   a centrifugal pump having a motor and an impeller, the impeller being positioned within the lower chamber, wherein a plurality of channels in the lower chamber directs the cooling liquid from the first passage to the impeller and from the impeller to the second passage; and
   a heat exchanger spaced apart and fluidly coupled to the reservoir.

14. The cooling system of claim 13, further including a control system, wherein the control system is configured to adjust a speed of the pump.

15. The cooling system of claim 14, wherein the control system is part of an operating system of the computer.

16. The cooling system of claim 14, wherein the control system is configured to measure one of an operating load or an operating temperature of the processing unit and adjust the pump based on the measured value.

17. The cooling system of claim 14, wherein the control system is configured to determine a required cooling capacity of the cooling system and adjust a rotational speed of the pump based on the required cooling capacity.

18. The cooling system of claim 17, wherein the control system is configured to reduce the rotational speed of the pump if lower cooling capacity is required.

19. The cooling system of claim 14, wherein the control system is configured to adjust a rotational speed of a fan and a rotational speed of the pump to reduce noise and provide a required cooling capacity of the cooling system.

* * * * *